US011527528B2

(12) United States Patent
Zeng et al.

(10) Patent No.: US 11,527,528 B2
(45) Date of Patent: Dec. 13, 2022

(54) ELECTROSTATIC DISCHARGE PROTECTION DEVICES AND METHODS OF FORMING ELECTROSTATIC DISCHARGE PROTECTION DEVICES

(71) Applicant: GLOBALFOUNDRIES Singapore Pte. Ltd., Singapore (SG)

(72) Inventors: Jie Zeng, Singapore (SG); Raunak Kumar, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 235 days.

(21) Appl. No.: 16/853,777

(22) Filed: Apr. 21, 2020

(65) Prior Publication Data

US 2021/0327869 A1     Oct. 21, 2021

(51) Int. Cl.
| | |
|---|---|
| *H01L 27/02* | (2006.01) |
| *H01L 29/06* | (2006.01) |
| *H01L 21/762* | (2006.01) |
| *H01L 29/165* | (2006.01) |

(52) U.S. Cl.
CPC .... *H01L 27/0259* (2013.01); *H01L 21/76202* (2013.01); *H01L 27/0248* (2013.01); *H01L 29/063* (2013.01); *H01L 29/0646* (2013.01); *H01L 29/165* (2013.01)

(58) Field of Classification Search
CPC ....... H01L 27/0248–0296; H01L 23/60; H01L 29/63; H01L 27/0259; H01L 29/063; H01L 29/0646; H01L 29/165
See application file for complete search history.

(56) References Cited

U.S. PATENT DOCUMENTS

| | | | |
|---|---|---|---|
| 7,723,823 | B2 | 5/2010 | Gill et al. |
| 7,786,507 | B2 | 8/2010 | Denison et al. |
| 8,390,096 | B2 | 3/2013 | Hwang |
| 10,020,386 | B1 | 7/2018 | Singh et al. |
| 10,037,988 | B1 | 7/2018 | Solaro et al. |
| 10,224,411 | B2 | 3/2019 | Mallikarjunaswamy et al. |

(Continued)

OTHER PUBLICATIONS

Vashchenko et al., "Implementation of 60V Tolerant Dual Direction ESD Protection in 5V BiCMOS Process for Automotive Application", 2004 Electrical Overstress/Electrostatic Discharge Symposium, 2004, 8 pages, IEEE.

(Continued)

*Primary Examiner* — Jose R Diaz
(74) *Attorney, Agent, or Firm* — Viering Jentschura & Partner MBB

(57) ABSTRACT

An electrostatic discharge (ESD) protection device may be provided, including a substrate having a conductivity region arranged therein, a first terminal region and a second terminal region arranged within the conductivity region, and a field distribution structure. The field distribution structure may include an intermediate region arranged within the conductivity region between the first terminal region and the second terminal region, an isolation element arranged over the intermediate region, and a first conductive plate and a second conductive plate arranged over the isolation element. The first conductive plate may be electrically connected to the first terminal region and the second conductive plate may be electrically connected to the second terminal region.

20 Claims, 14 Drawing Sheets

(56) References Cited

U.S. PATENT DOCUMENTS

| | | |
|---|---|---|
| 10,269,895 B2 | 4/2019 | Babcock et al. |
| 2012/0275072 A1* | 11/2012 | Chen .................. H01L 27/0262 361/56 |
| 2016/0351571 A1* | 12/2016 | Chan ..................... H01L 27/027 |
| 2021/0134787 A1 | 5/2021 | Zeng et al. |

OTHER PUBLICATIONS

Renaud et al., "High robustness PNP-based structure for the ESD protection of high voltage I/Os in an advanced smart power technology", 2007 IEEE Bipolar/BiCMOS Circuits and Technology Meeting, 2007, pp. 226-229, IEEE.

Vashchenko et al., "Multi-Port ESD Protection Using Bi-Directional SCR Structures", 2003 Proceedings of the Bipolar/BiCMOS Circuits and Technology Meeting, 2003, pp. 137-140, IEEE.

* cited by examiner

ELECTROSTATIC DISCHARGE PROTECTION DEVICES AND METHODS OF FORMING ELECTROSTATIC DISCHARGE PROTECTION DEVICES

TECHNICAL FIELD

The present disclosure relates generally to electrostatic discharge (ESD) protection devices, and methods of forming the ESD protection devices.

BACKGROUND

ESD protection devices are often used to protect electrical devices from being damaged by ESD events. FIG. 1A shows a simplified cross-sectional view of an exemplary prior art ESD protection device 100. As shown in FIG. 1A, the prior art ESD protection device 100 includes a p-type substrate 102 and a deep n-well 104 arranged within the p-type substrate 102. A collector region 106 and an emitter/base region 108 are arranged within the deep n-well 104. The collector region 106 includes a high voltage p-well 1061, a p-well 1062 within the high voltage p-well 1061 and a p-type contact 1063 within the p-well 1062. The emitter/base region 108 includes an n-well 1081, and a p-type contact 1082 and an n-type contact 1083 within the n-well 1081. The p-type contact 1082 and the n-type contact 1083 are electrically isolated from each other by an isolation structure 110 therebetween. Further isolation structures 112, 114 are provided at opposite sides of the prior art ESD protection device 100. The collector region 106 is electrically connected to a terminal point 116 and the emitter/base region 108 is electrically connected to a terminal point 118.

In use, the prior art ESD protection device 100 is connected to a pair of terminals of an electrical device via the terminal points 116, 118. FIG. 1B shows an equivalent circuit of the prior art ESD protection device 100 and FIG. 1C shows a current-voltage plot of the device 100 in use. As shown in FIGS. 1B and 1C, the device 100 operates as a transistor device when the voltage bias between the terminal points 116, 118 is in a positive direction. When this positive voltage bias exceeds a triggering voltage $V_T$ of the ESD protection device 100 (due to an ESD event within the electrical device), the ESD protection device 100 turns on and conducts current away from the electrical device. This helps to prevent the electrical device from being damaged by the excess current caused by the ESD event. The current conducted through the ESD protection device 100 may be referred to as the discharge current or the ESD current. The ESD protection device 100 is usually designed to have a triggering voltage that is slightly lower than a maximum voltage the electrical device can withstand before it is destroyed (or in other words, a breakdown voltage of the electrical device).

On the other hand, as shown in FIGS. 1B and 1C, when the voltage bias between the terminal points 116, 118 is in a negative direction, the prior art ESD protection device 100 behaves like a diode. In other words, the device 100 is a uni-directional device that is unable to support dual polarity bias. To overcome this, a pair of the devices 100 may be electrically connected in a back-to-back stack configuration as shown in FIG. 1D. However, such a structure tends to have a high silicon footprint and a high on-resistance. Further, prior art ESD protection devices, such as the device 100, also tend to suffer from problems such as a low failure current and a high on-resistance.

SUMMARY

According to various non-limiting embodiments, there may be provided an ESD protection device including: a substrate including a conductivity region arranged therein; a first terminal region and a second terminal region arranged within the conductivity region; and a field distribution structure including: an intermediate region arranged within the conductivity region between the first terminal region and the second terminal region; an isolation element arranged over the intermediate region; and a first conductive plate and a second conductive plate arranged over the isolation element. The first conductive plate may be electrically connected to the first terminal region and the second conductive plate may be electrically connected to the second terminal region.

According to various non-limiting embodiments, there may be provided a method of forming an ESD protection device. The method may include providing a substrate; forming a conductivity region within the substrate; forming a first terminal region and a second terminal region within the conductivity region; forming a field distribution structure including: an intermediate region within the conductivity region between the first terminal region and the second terminal region; an isolation element over the intermediate region; and a first conductive plate and a second conductive plate over the isolation element. The method may further include forming an electrical connection between the first conductive plate and the first terminal region; and forming an electrical connection between the second conductive plate and the second terminal region.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

Figure 1A:
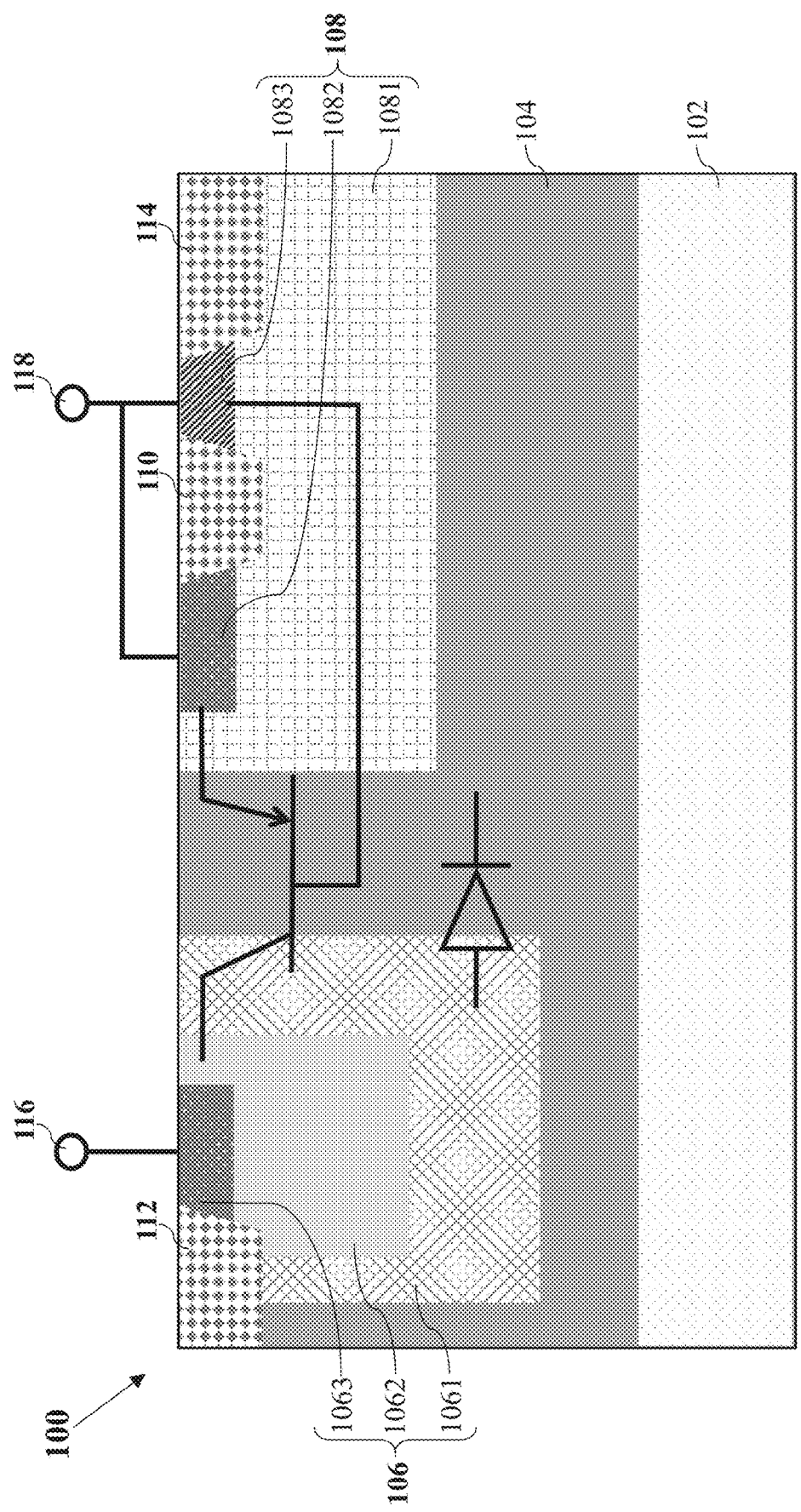
FIG. 1A shows a simplified cross-sectional view of an exemplary prior art ESD protection device.
Figure 1C:
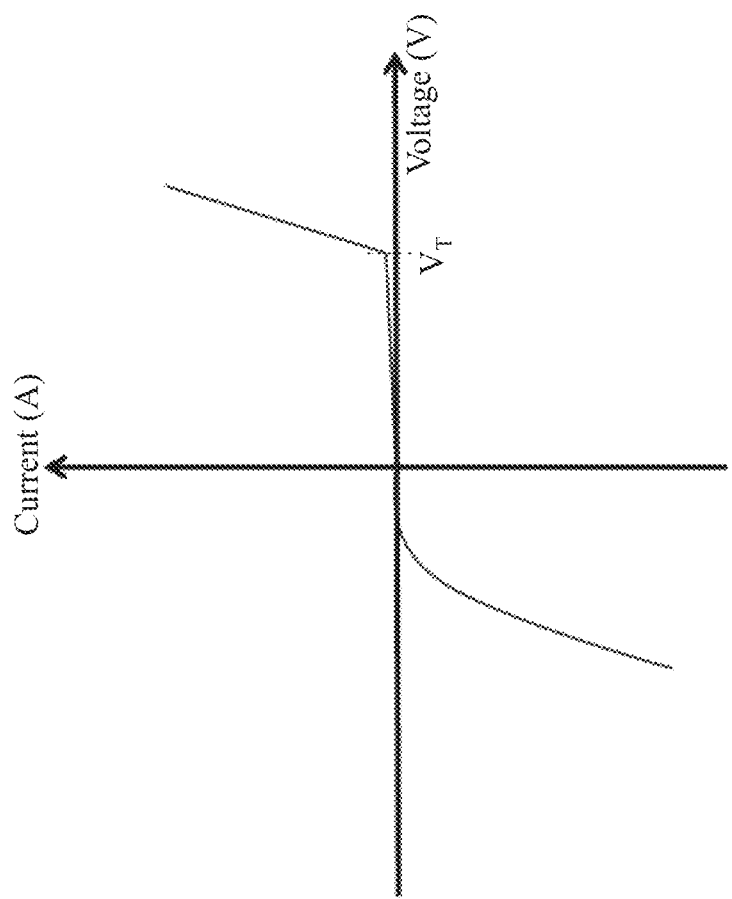
FIG. 1C shows a current-voltage plot of the prior art device of FIG. 1A
Figure 1B:
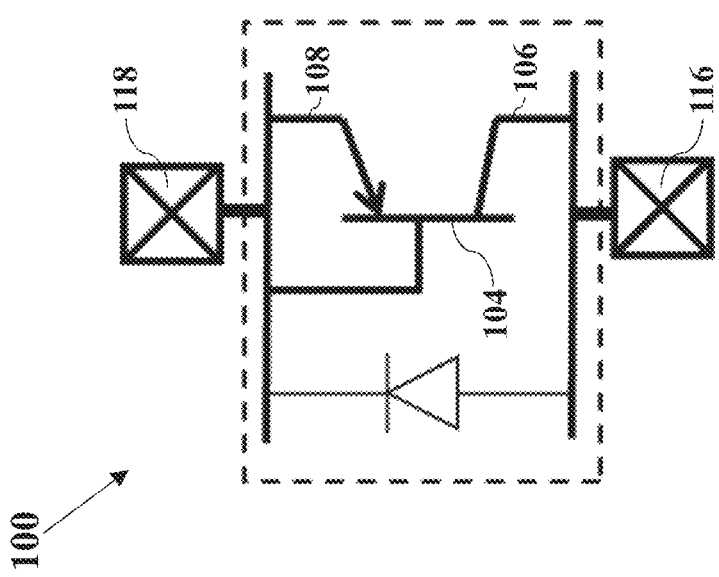
FIG. 1B shows an equivalent circuit of the prior art device of FIG. 1A.
Figure 1D:
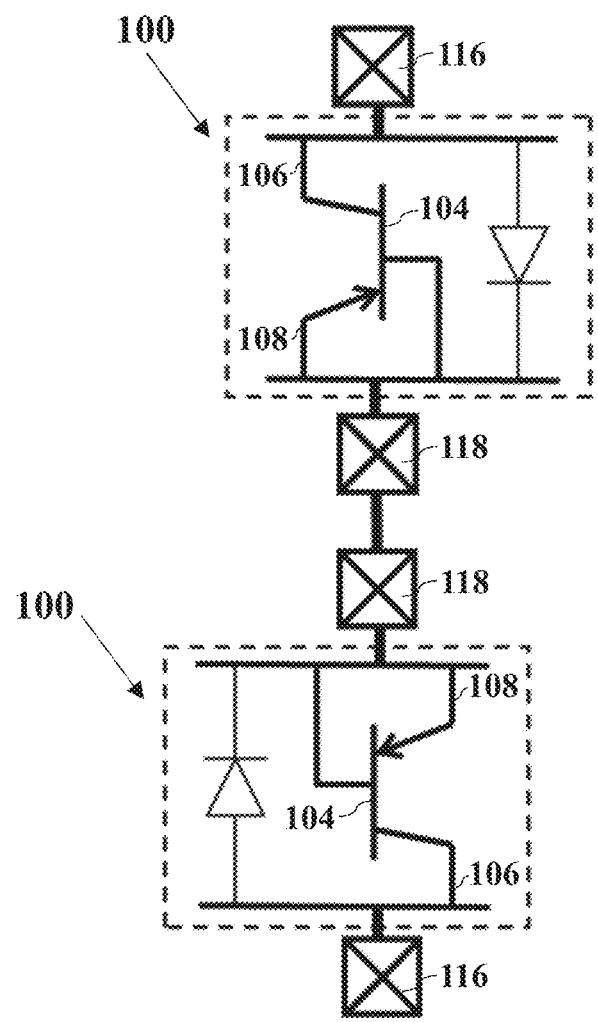
FIG. 1D shows a structure including a pair of the prior art devices of FIG. 1A.

The embodiments generally relate to semiconductor devices. More particularly, some embodiments relate to ESD protection devices. The ESD protection devices may, for example, be incorporated into integrated circuits (ICs) that may be used for various types of products, such as, but not limited to, consumer electronic products.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 2A:
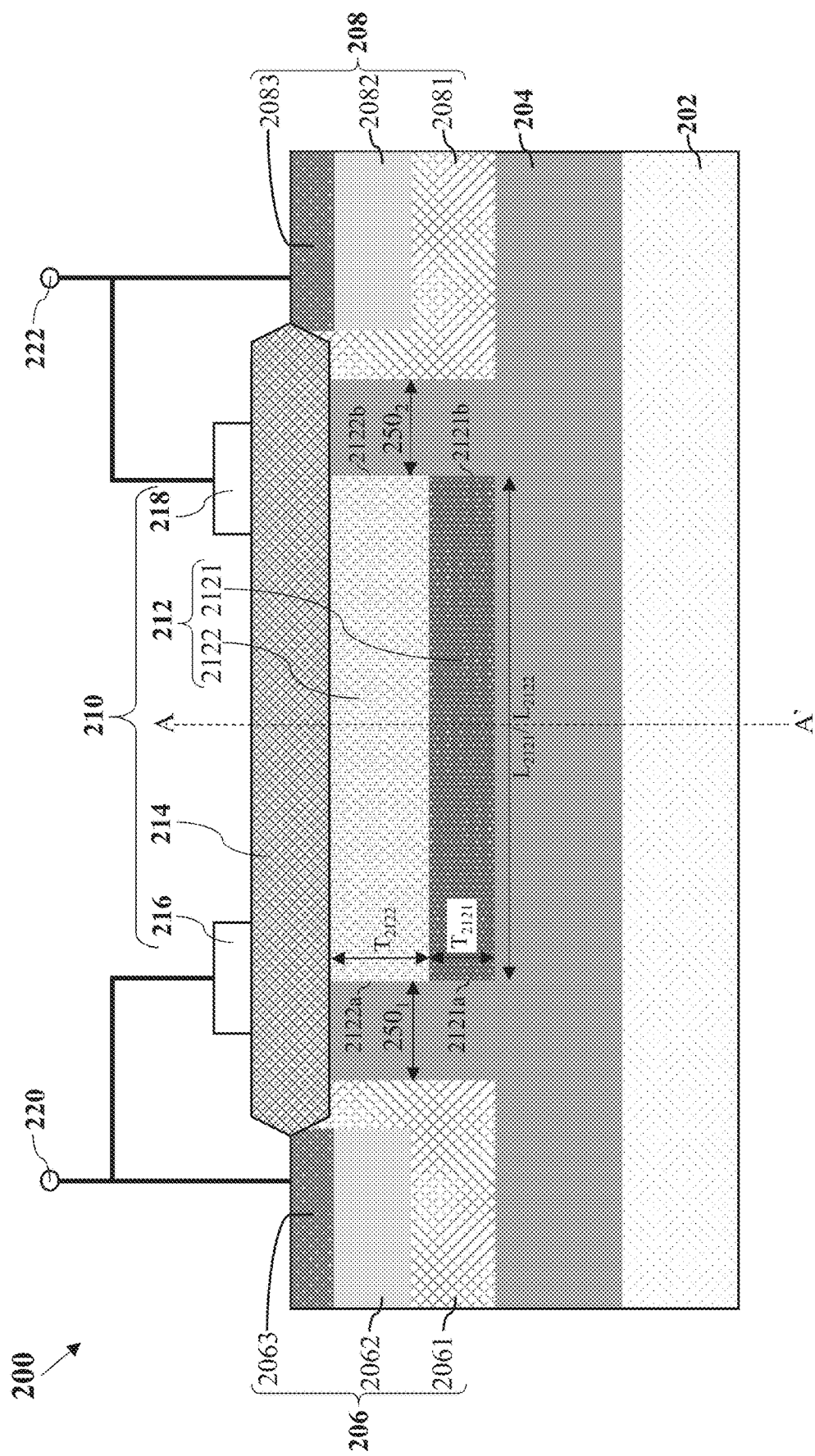
FIG. 2A shows a simplified cross-sectional view of an ESD protection device according to various non-limiting embodiments.

FIG. 2A shows a simplified cross-sectional view of an ESD protection device 200 according to various non-limiting embodiments. As shown in FIG. 2A, the ESD protection device 200 may be symmetrical about a centre axis A-A'.

The ESD protection device 200 may include a substrate 202. The substrate 202 may include a semiconductor material and may, for example, be a semiconductor-on-insulator substrate. The semiconductor material may include material such as, but not limited to, silicon (Si), germanium (Ge), silicon carbide (SiC), gallium arsenide (GaAs), gallium nitride (GaN), or combinations thereof. In addition, the substrate 202 may include a conductivity region 204 arranged therein. The conductivity region 204 may include a high voltage well that may be an epitaxial layer.

The ESD protection device 200 may also include a first terminal region 206 and a second terminal region 208 arranged within the conductivity region 204. Accordingly, each terminal region 206, 208 may be electrically isolated from the substrate 202 by a part of the conductivity region 204. Each of the first terminal region 206 and the second terminal region 208 may include a drift portion 2061, 2081, a well portion 2062, 2082 arranged within the drift portion 2061, 2081 and a contact portion 2063, 2083 arranged within the well portion 2062, 2082. The drift portion 2061, 2081 may be a high voltage well. As shown in FIG. 2A, the first terminal region 206 and the second terminal region 208 may be arranged at respective corners of the substrate 202. For each terminal region 206, 208, the well portion 2062, 2082 and the contact portion 2063, 2083 may be aligned with the corner at which the terminal region 206, 208 is arranged. In FIG. 2A, the contact portion 2063, 2083 is depicted as adjoining the drift portion 2061, 2081, but the contact portion 2063, 2083 may alternatively be spaced apart from the drift portion 2061, 2081 by a part of the well portion 2062, 2082.

Although not shown in FIG. 2A, the ESD protection device 200 may further include an optional isolating member arranged within each of the first terminal region 206 and the second terminal region 208. In particular, each isolating member may be arranged within the contact portion 2063, 2083 of the respective terminal region 206, 208 and may extend into the well portion 2062, 2082. Further, each isolating member may be aligned with the corner at which the respective terminal region 206, 208 is arranged. Each isolating member may include an isolating material, such as, but not limited to, a gap fill oxide, nitride or combinations thereof. For example, each isolating member may be a shallow trench isolation (STI) structure.

Referring to FIG. 2A, the ESD protection device 200 may further include a field distribution structure 210 arranged partially within the conductivity region 204, and between the first and second terminal regions 206, 208. The field distribution structure 210 may include a reduced surface field (RESURF) structure.

The field distribution structure 210 may include an intermediate region 212 arranged within the conductivity region 204 between the first terminal region 206 and the second terminal region 208. In particular, the intermediate region 212 may be arranged entirely within the conductivity region 204. The intermediate region 212 may be separated from each of the first terminal region 206 and the second terminal region 208, with a portion of the conductivity region 204 arranged between the intermediate region 212 and the first terminal region 206, and another portion of the conductivity region 204 arranged between the intermediate region 212 and the second terminal region 208. As shown in FIG. 2A, the intermediate region 212 may be laterally spaced apart from the first terminal region 206 and the second terminal region 208. In particular, a first lateral spacing $250_1$ may be arranged between the intermediate region 212 and the first terminal region 206, and a second lateral spacing $250_2$ may be arranged between the intermediate region 212 and the second terminal region 208. A length of the first lateral spacing $250_1$ and a length of the second lateral spacing $250_2$ may be approximately equal. However, the lengths of the first and second lateral spacings $250_1$, $250_2$ may alternatively be different. The length of each lateral spacing $250_1$, $250_2$ may range from about 0.5 um to about 2 um. In some specific non-limiting embodiments, at least one of the length of the first lateral spacing $250_1$ and the length of the second lateral spacing $250_2$ may be greater than or equal to 1.6 um. In FIG. 2A, the intermediate region 212 is depicted as having a same depth into the conductivity region 204 as the first and second terminal regions 206, 208. However, the intermediate region 212 may have a different depth from the first and second terminal regions 206, 208.

As shown in FIG. 2A, the intermediate region 212 may include a buried layer 2121 and a drift region 2122 arranged over the buried layer 2121. The buried layer 2121 may have a first side 2121a and a second side 2121b opposite to the first side 2121a, and the drift region 2122 may have a first side 2122a and a second side 2122b opposite to the first side 2122a. The first sides 2121a, 2122a of the buried layer 2121 and the drift region 2122 may be vertically aligned, and the second sides 2121b, 2122b of the buried layer 2121 and the drift region 2122 may also be vertically aligned. In other words, the buried layer 2121 and the drift region 2122 may have equal lengths $L_{2121}$, $L_{2122}$ along the lateral direction. However, these lengths $L_{2121}$, $L_{2122}$ may be different in some non-limiting alternative embodiments, as long as the buried layer 2121 is separated from each terminal region 206, 208 by the conductivity region 204. The length $L_{2122}$ of the drift region 2122 may be configured to achieve a lower on-resistance for the ESD protection device 200, while maintaining the device's 200 ability to withstand a high breakdown voltage. For example, the length $L_{2122}$ of the drift region 2122 may range from about 1 um to about 12 um. Further, although a thickness $T_{2122}$ of the drift region 2122 is depicted in FIG. 2A as being greater than a thickness $T_{2121}$ of the buried layer 2121, the thicknesses $T_{2121}$, $T_{2122}$ may be approximately equal or the thickness $T_{2122}$ of the drift region 2122 may be smaller than the thickness $T_{2121}$ of the buried layer 2121.

The substrate 202, the first terminal region 206, the second terminal region 208 and the buried layer 2121 may have a first conductivity type, or in other words, may include dopants of the first conductivity type. The conductivity region 204 and the drift region 2122 may have a second conductivity type different from the first conductivity type, or in other words, may include dopants of the second conductivity type. For example, when the substrate 202, the first terminal region 206, the second terminal region 208 and the buried layer 2121 are of p-type conductivity, the conductivity region 204 and the drift region 2122 may be of n-type conductivity, and vice versa. The p-type dopants may include boron (B), aluminum (Al), indium (In), or combinations thereof; whereas, the n-type dopants may include phosphorous (P), arsenic (As), antimony (Sb), or combinations thereof.

The substrate 202 may be lightly doped, for example, with a doping concentration in a range from about $1E15$ cm$^{-3}$ to about $1E16$ cm$^{-3}$. The conductivity region 204 may have a higher doping concentration than the substrate 202, for example, in a range from about $5E15$ cm$^{-3}$ to about $5E16$ cm$^{-3}$. The drift portion 2061, 2081 of each of the first terminal region 206 and the second terminal region 208 may have a higher doping concentration than the conductivity region 204. In each of the terminal regions 206, 208, the well portion 2062, 2082 may have a higher doping concentration than the drift portion 2061, 2081, and the contact portion 2063, 2083 may have a higher doping concentration than the well portion 2062, 2082. For example, the drift portion 2061, 2081 may have a doping concentration in a range from about $1E16$ cm$^{-3}$ to about $5E17$ cm$^{-3}$; the well portion 2062, 2082 may have a doping concentration in a range from about $1E17$ cm$^{-3}$ to about $1E19$ cm$^{-3}$, and the contact portion 2063, 2083 may have a doping concentration in a range from about $5E19$ cm$^{-3}$ to about $5E20$ cm$^{-3}$. The relative concentrations of the drift portion 2061, 2081, well portion 2062, 2082 and contact portion 2063, 2083 of each terminal region 206, 208 can help to increase the breakdown voltage that the ESD protection device 200 can withstand, and can also help to increase the amount of discharge current the ESD protection device 200 is capable of carrying. The buried layer 2121 of the intermediate region 212 may also have a higher doping concentration than the conductivity region 204; whereas, the drift region 2122 of the intermediate region 212 may have a doping concentration approximately equal to that of the buried layer 2121. For example, the buried layer 2121 may have a doping concentration in a range from about $1E16$ cm$^{-3}$ to about $1E17$ cm$^{-3}$, and the drift region 2122 may have a doping concentration in a range from about $1E16$ cm$^{-3}$ to about $1E17$ cm$^{-3}$.

Referring to FIG. 2A, the field distribution structure 210 may further include an isolation element 214 arranged over the intermediate region 212, in particular, over the drift region 2122. The isolation element 214 may adjoin the first terminal region 206 and the second terminal region 208, and may extend continuously between these terminal regions 206, 208. In particular, the isolation element 214 may extend between the contact portion 2063 of the first terminal region 206 and the contact portion 2083 of the second terminal region 208. As shown in FIG. 2A, the isolation element 214 may extend across the drift region 2061 of the first terminal region 206 to adjoin the contact portion 2063 of the first terminal region 206, and across the drift region 2081 of the second terminal region 208 to adjoin the contact portion 2083 of the second terminal region 208. In FIG. 2A, the isolation element 214 is depicted as extending partially into the contact portions 2063, 2083, but alternatively, the isolation element 214 may be entirely external of the contact portions 2063, 2083. Further, as shown in FIG. 2A, the isolation element 214 may be arranged partially within the conductivity region 204, and a part of the isolation element 214 may extend above the substrate 202. The isolation element 214 may include a local oxidation of silicon (LOCOS) element. Using a LOCOS element as the isolation element 214 may help to reduce the manufacturing costs of the ESD protection device 200.

The field distribution structure 210 may further include a first conductive plate 216 and a second conductive plate 218 arranged over the isolation element 214. The first and second conductive plates 216, 218 may each include a conductive material, such as, but not limited to, polysilicon, metal or combinations thereof. The first conductive plate 216 may be electrically connected to the first terminal region 206 and the second conductive plate 218 may be electrically connected to the second terminal region 208. In particular, the first conductive plate 216 may be electrically connected to the contact portion 2063 of the first terminal region 206 and the second conductive plate 218 may be electrically connected to the contact portion 2083 of the second terminal region 208. The first and second conductive plates 216, 218 may be spaced apart from each other, and hence, electrically isolated from each other by the isolating element 214.

As shown in FIG. 2A, the first conductive plate 216 and the contact portion 2063 of the first terminal region 206 may be electrically connected to a first terminal point 220; whereas, the second conductive plate 218 and the contact portion 2083 of the second terminal region 208 may be electrically connected to a second terminal point 222. The first terminal point 220 and the second terminal point 222 may be connected to respective connectors of an electrical device (not shown in the figures), so that the ESD protection device 200 may protect this electrical device from damage caused by ESD events. At least a part of the first conductive plate 216 may be in vertical alignment with a first p-n junction between the buried layer 2121 (the first side 2121a of the buried layer 2121) and the conductivity region 204, and at least a part of the second conductive plate 218 may be in vertical alignment with a second p-n junction between the buried layer 2121 (the second side 2121b of the buried layer 2121) and the conductivity region 204. This can help to reduce the electric field near the surface of the substrate 202, so that the ESD protection device 200 is capable of withstanding a higher voltage bias between the terminal points 220, 222 before it is turned on.

Figure 2B:
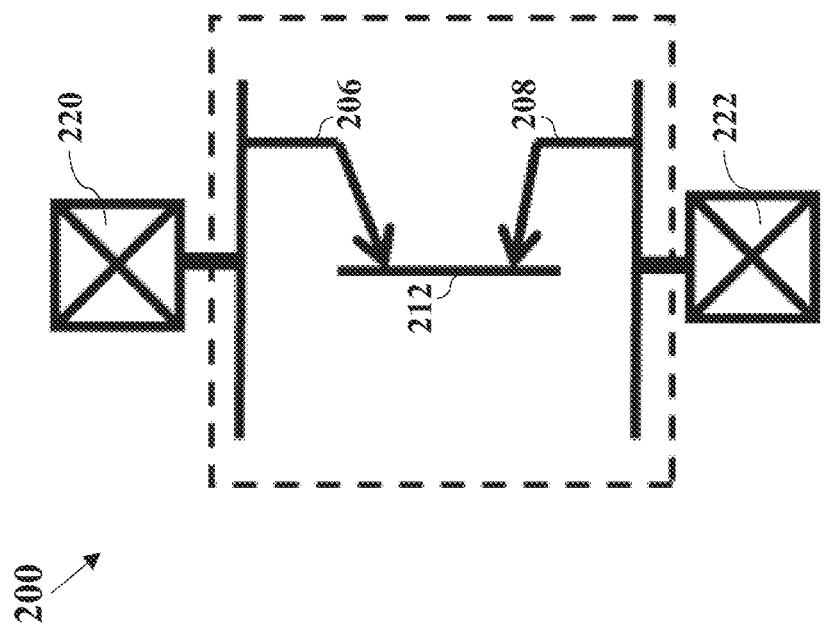
FIG. 2B shows an equivalent circuit of the ESD protection device of FIG. 2A.

FIG. 2B shows an equivalent circuit of the ESD protection device 200. As shown in FIG. 2B, the ESD protection device 200 may operate as a transistor device. In particular, each of the first terminal region 206 and the second terminal region 208 may serve as an emitter or a collector of the transistor device, depending on which of the voltage at the first terminal point 220 and the voltage at the second terminal point 222 is higher. The intermediate region 212 of the field distribution structure 210 may serve as a base of the transistor device.

Figure 3:
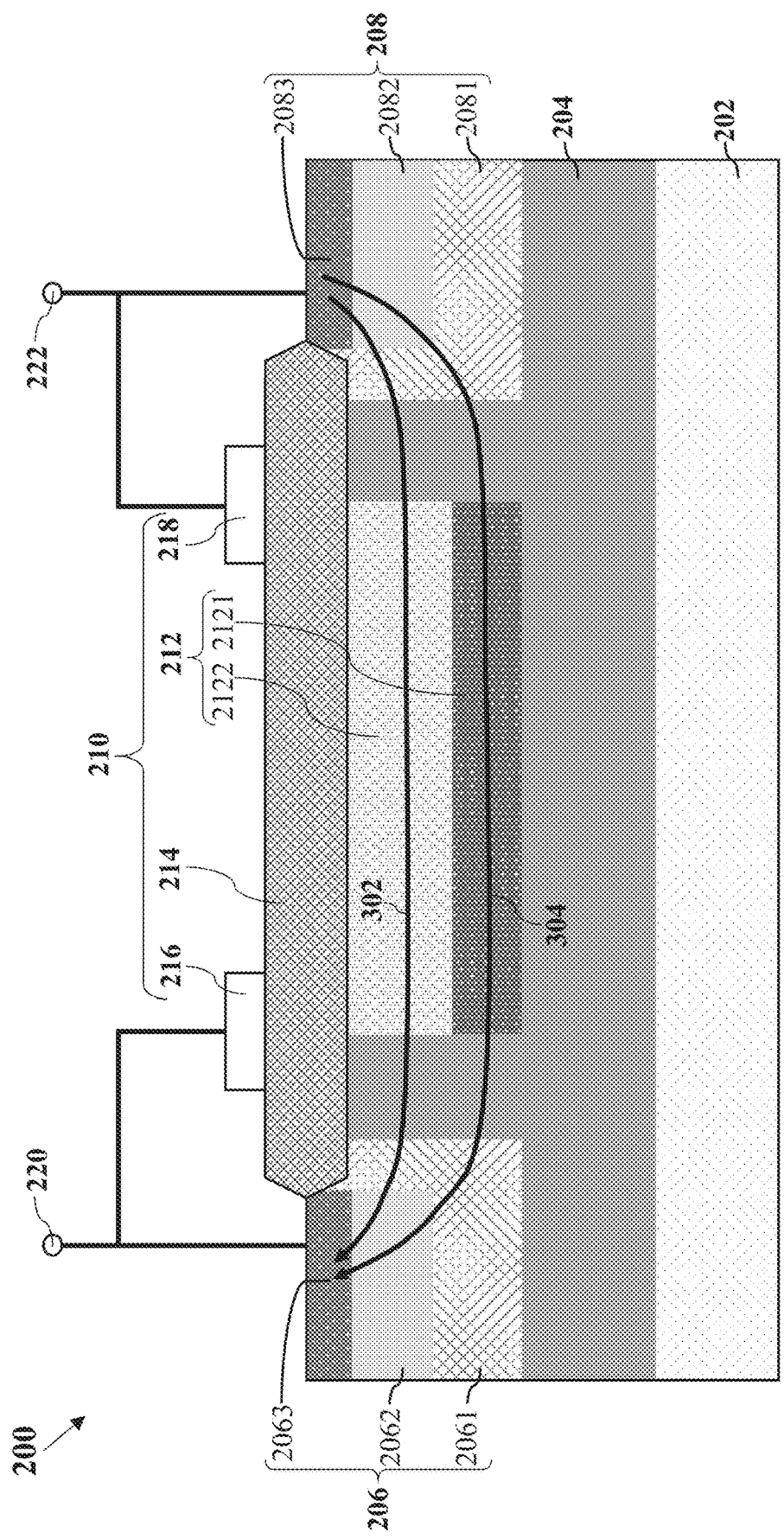
FIG. 3 shows the ESD protection device of FIG. 2A in use.

FIG. 3 shows the ESD protection device 200 in use, with the first conductivity type being p-type and the second conductivity type being n-type. To avoid cluttering the figure, the dimensions $T_{2121}$, $T_{2122}$, $L_{2121}/L_{2122}$, $250_1$, $250_2$ and sides $2121a$, $2122a$, $2121b$, $2122b$ are not labelled in FIG. 3.

In use, the terminal points 220, 222 of the ESD protection device 200 may be connected to respective connectors of the electrical device to be protected (not shown in FIG. 3); whereas, the conductivity region 204 may be floating. When the voltage at the second terminal point 222 is higher than that at the first terminal point 220, and a voltage difference between these terminal points 220, 222 exceed the triggering voltage of the ESD protection device 200, a first current 302 and a second current 304 may flow through the ESD protection device 200 as shown in FIG. 3. The second current 304 may be the main discharge current and may be much greater in magnitude than the first current 302.

In particular, as shown in FIG. 3, the first current 302 may flow from the contact portion 2083 of the second terminal region 208 through the well portion 2082 and the drift portion 2081 of the second terminal region 208. The first current 302 may further pass through a first part of the conductivity region 204 (between the intermediate region 212 and the second terminal region 208), the drift region 2122 of the intermediate region 212, and subsequently, a second part of the conductivity region 204 (between the intermediate region 212 and the first terminal region 206). Thereafter, the first current 302 may flow through the drift portion 2061 and the well portion 2062 of the first terminal region 206 to reach the contact portion 2063 of the first terminal region 206.

The second current 304 may similarly flow from the contact portion 2083 of the second terminal region 208 through the well portion 2082 and the drift portion 2081 of this terminal region 208. Similar to the first current 302, the second current 304 may then flow through the first part of the conductivity region 204. However, instead of the drift region 2122, the second current 304 may flow through the buried layer 2121 of the intermediate region 212. The second current 304 may then also flow through the second part of the conductivity region 204, and further through the drift portion 2061 and the well portion 2062 of the first terminal region 206 to reach the contact portion 2063 of this terminal region 206.

When the voltage at the first terminal point 220 is higher than the voltage at the second terminal point 222, and a voltage difference between these terminal points 220, 222 exceed the triggering voltage of the ESD protection device 200, first and second currents similar to the above-mentioned first and second currents 302, 304 may flow through the ESD protection device 200, except that the directions of these currents may be opposite to that described above. It would be clear to a person skilled in the art that the directions of these first and second currents 302, 304 and those described above will change accordingly when the first conductivity type and the second conductivity type are instead the n-type and the p-type respectively.

Figure 4:
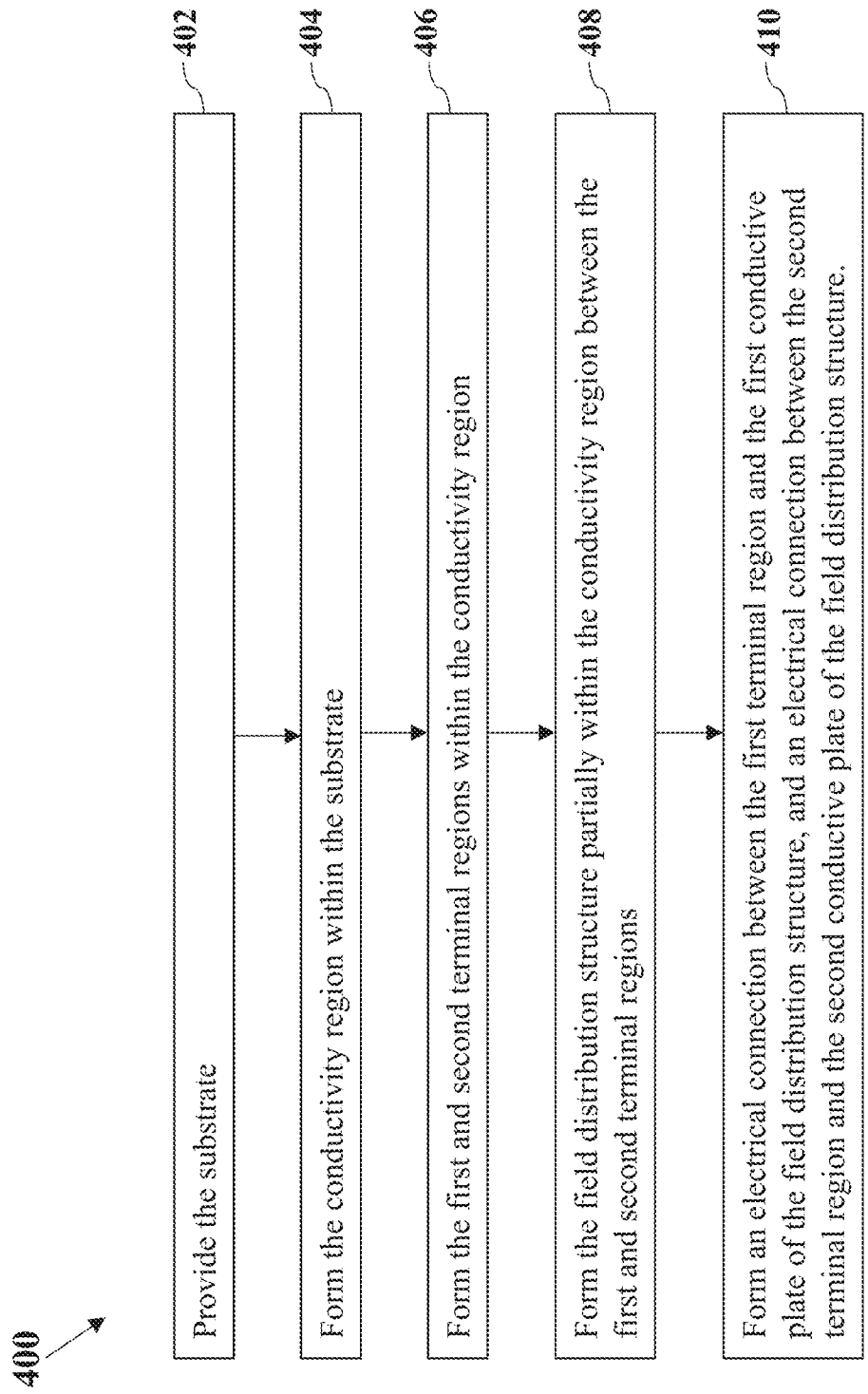
FIG. 4 shows a flowchart illustrating a method of forming the ESD protection device of FIG. 2A.

FIG. 4 shows a flow chart illustrating a method 400 of forming the ESD protection device 200 according to various non-limiting embodiments.

At 402, the substrate 202 may be provided.

At 404, the conductivity region 204 may be formed within the substrate 202. In particular, the conductivity region 204 may be formed by appropriately doping a portion of the substrate 202.

At 406, the first and second terminal regions 206, 208 may be formed within the conductivity region 204. In particular, portions of the substrate 202 may be doped with the appropriate concentrations and dopant types to form the drift portion 2061, 2081, the well portion 2062, 2082 and the contact portion 2063, 2083 of each terminal region 206, 208. The drift portions 2061, 2081 of both the terminal regions 206, 208 may first be formed simultaneously. The well portions 2062, 2082 of both the terminal regions 206, 208 may then be formed simultaneously within the respective drift portions 2061, 2081, and subsequently, the contact portions 2063, 2083 of both the terminal regions 206, 208 may be formed simultaneously within the respective well portions 2062, 2082.

At 408, the field distribution structure 210 may be formed partially within the conductivity region 204 between the first and second terminal regions 206, 208. In particular, the buried layer 2121 may be formed by appropriately doping a portion of the substrate 202 and the drift region 2122 may be formed by appropriately doping a portion of the substrate 202 above the buried layer 2121. The isolation element 214 may then be formed by oxidizing a top portion of the substrate 202, and the conductive plates 216, 218 may be formed by depositing conductive material over the isolation element 214.

At 410, an electrical connection may be formed between the first conductive plate 216 and the first terminal region 206 (in particular, the contact portion 2063) and an electrical connection may be formed between the second conductive plate 218 and the second terminal region 208 (in particular, the contact portion 2083). These electrical connections may also electrically connect the contact portions 2063, 2083 of the first and second terminal regions 206, 208 to the first and second terminal points 220, 222 respectively.

The above described order for the method is only intended to be illustrative, and the method is not limited to the above specifically described order unless otherwise specifically stated.

Figure 5:
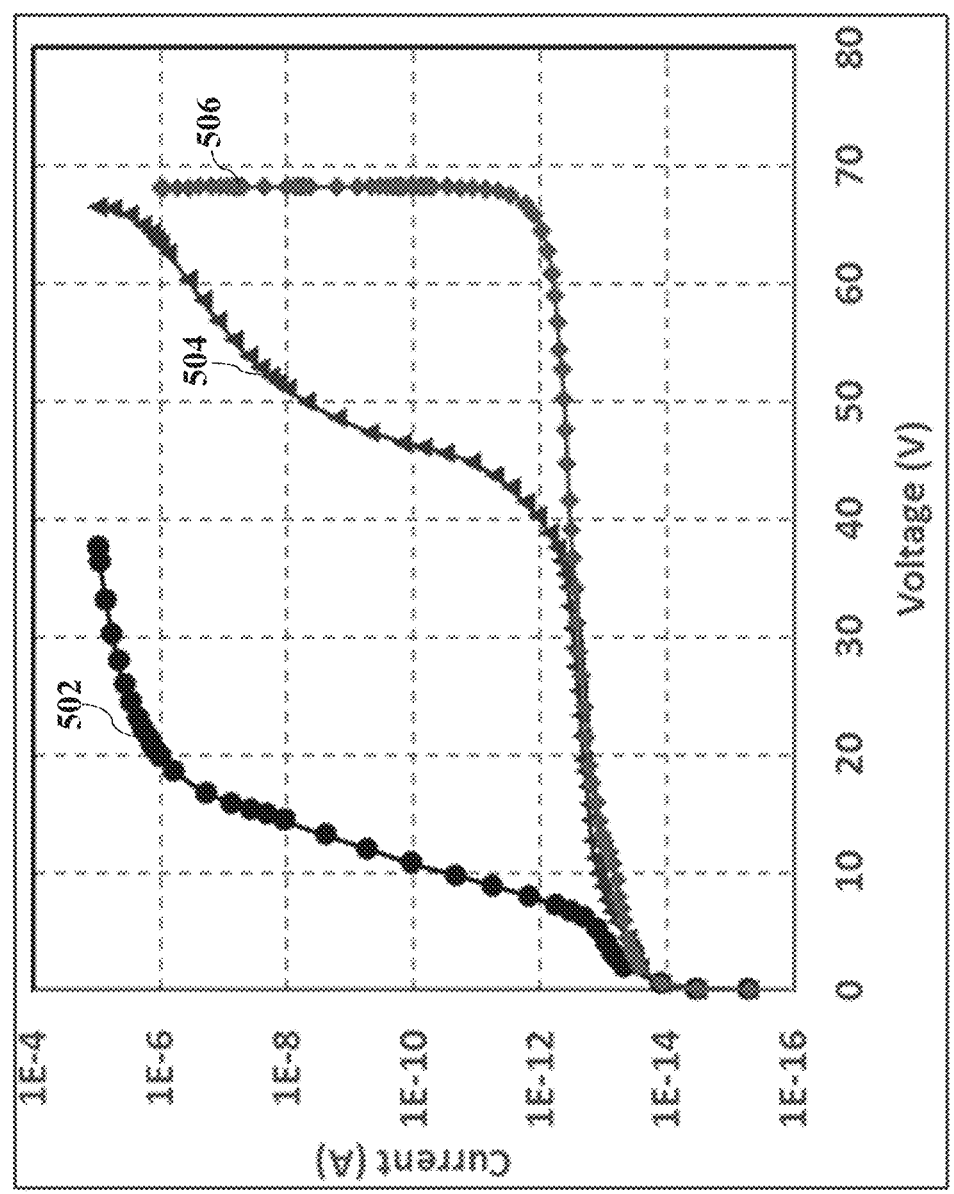
FIG. 5 shows simulated direct current (DC) current-voltage (I-V) curves of the ESD protection device of FIG. 2A.

FIG. 5 shows simulated direct current (DC) current-voltage (I-V) curves 502, 504, 506 of the ESD protection device 200 obtained using technology computer-aided design (TCAD). In particular, the curves 502, 504, 506 are obtained by setting the lengths of the lateral spacings $250_1$, $250_2$ between the intermediate region 212 and each of the first and second terminal regions 206, 208 at 0.8 um, 1.2 um and 1.6 um, respectively. As shown in FIG. 5, as the lengths of the lateral spacings $250_1$, $250_2$ increase, the triggering voltage of the ESD protection device 200 may increase. Accordingly, the ESD protection device 200 can withstand a higher breakdown voltage when the lengths of the lateral spacings $250_1$, $250_2$ of the device 200 are greater. Therefore, the ESD protection device 200 may be configured to have lateral spacings $250_1$, $250_2$ with lengths equal to or greater than 1.6 um, so as to withstand a higher breakdown voltage.

Figure 6:
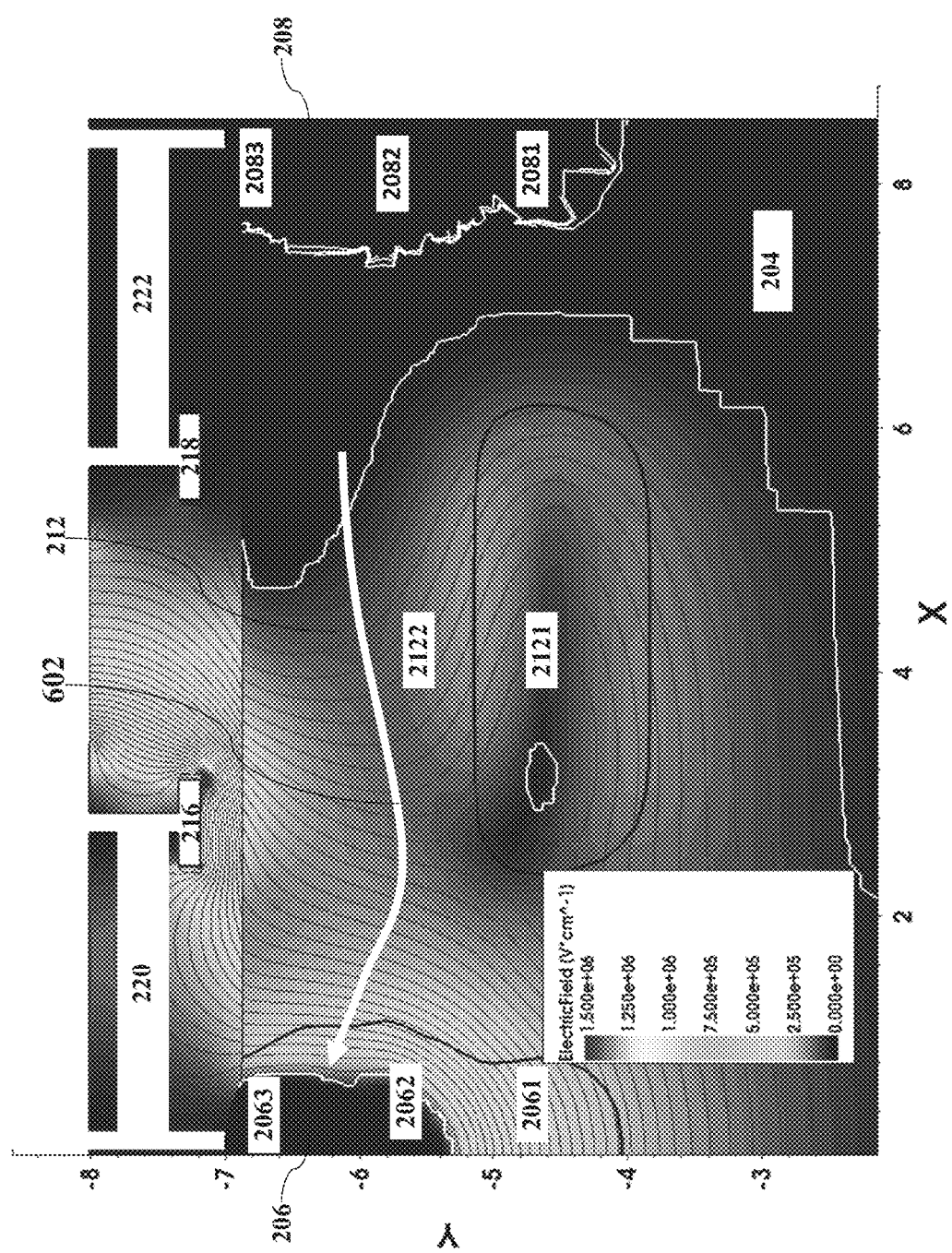
FIG. 6 shows a simulated electric field map of the ESD protection device of FIG. 2A.

FIG. 6 shows a potential and electric field map illustrating a simulated electric field within the ESD protection device 200 when the device 200 is turned on at its avalanche breakdown point. In FIG. 6, the white contours represent the boundaries of the depletion regions and the black contours represent the junction boundaries. The simulated electric field of FIG. 6 is obtained with the lengths of the lateral spacings $250_1$, $250_2$ set at 1.6 um, and with a voltage at the second terminal point 222 higher than a voltage at the first terminal point 220 (or in other words, with the electric potential decreasing in a direction from the second terminal point 222 to the first terminal point 220 as indicated by the arrow 602). As shown in FIG. 6, by including the field distribution structure 210, the electric field distribution within the substrate 202 of the ESD protection device 200 may be more uniform.

Figure 7:
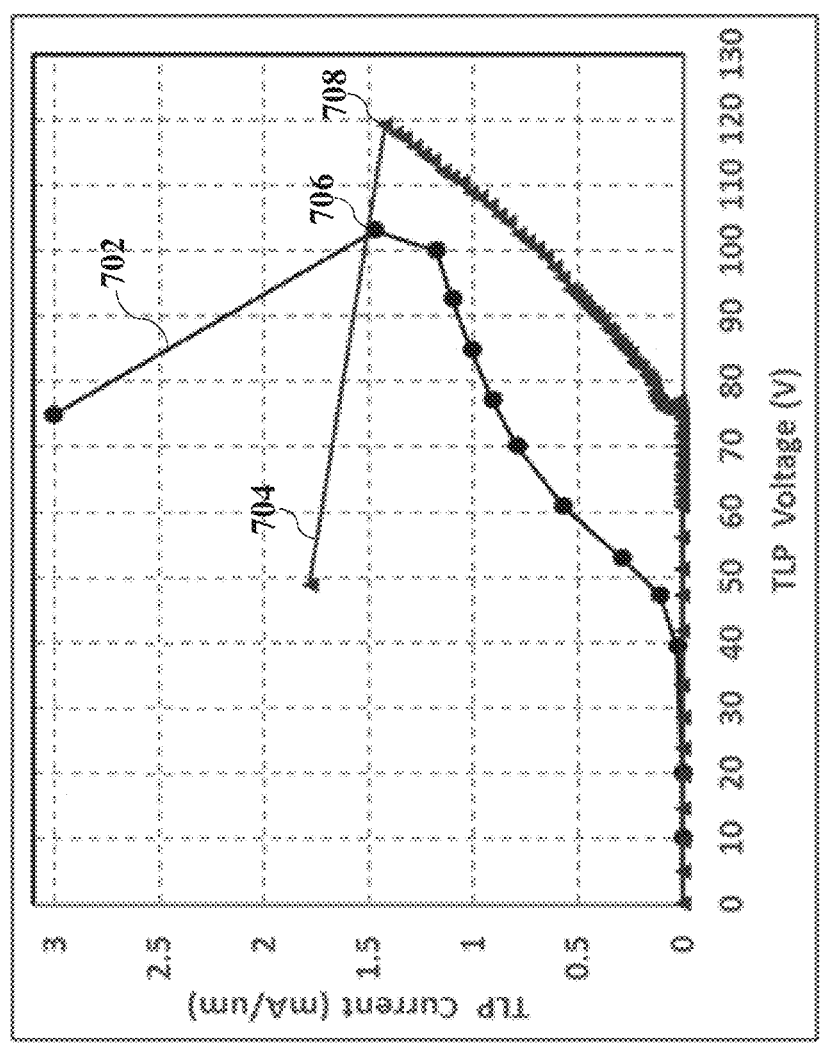
FIG. 7 shows simulated transmission line pulse (TLP) current-voltage (I-V) curves of the ESD protection device of FIG. 2A and of a prior art uni-directional ESD protection device.

FIG. 7 shows a simulated transmission line pulse (TLP) current-voltage (I-V) curve 702 of the ESD protection device 200 and a simulated TLP I-V curve 704 of a prior art uni-directional ESD protection device. As shown in FIG. 7, the simulated failure current (at point 706) of the ESD protection device 200 is similar to that (at point 708) of the prior art device. However, the on-resistance of the ESD protection device 700 is much lower than that of the prior art device as shown by the curves 702, 704. Accordingly, the ESD protection device 200 has a better voltage clamp ability.

Figure 8:
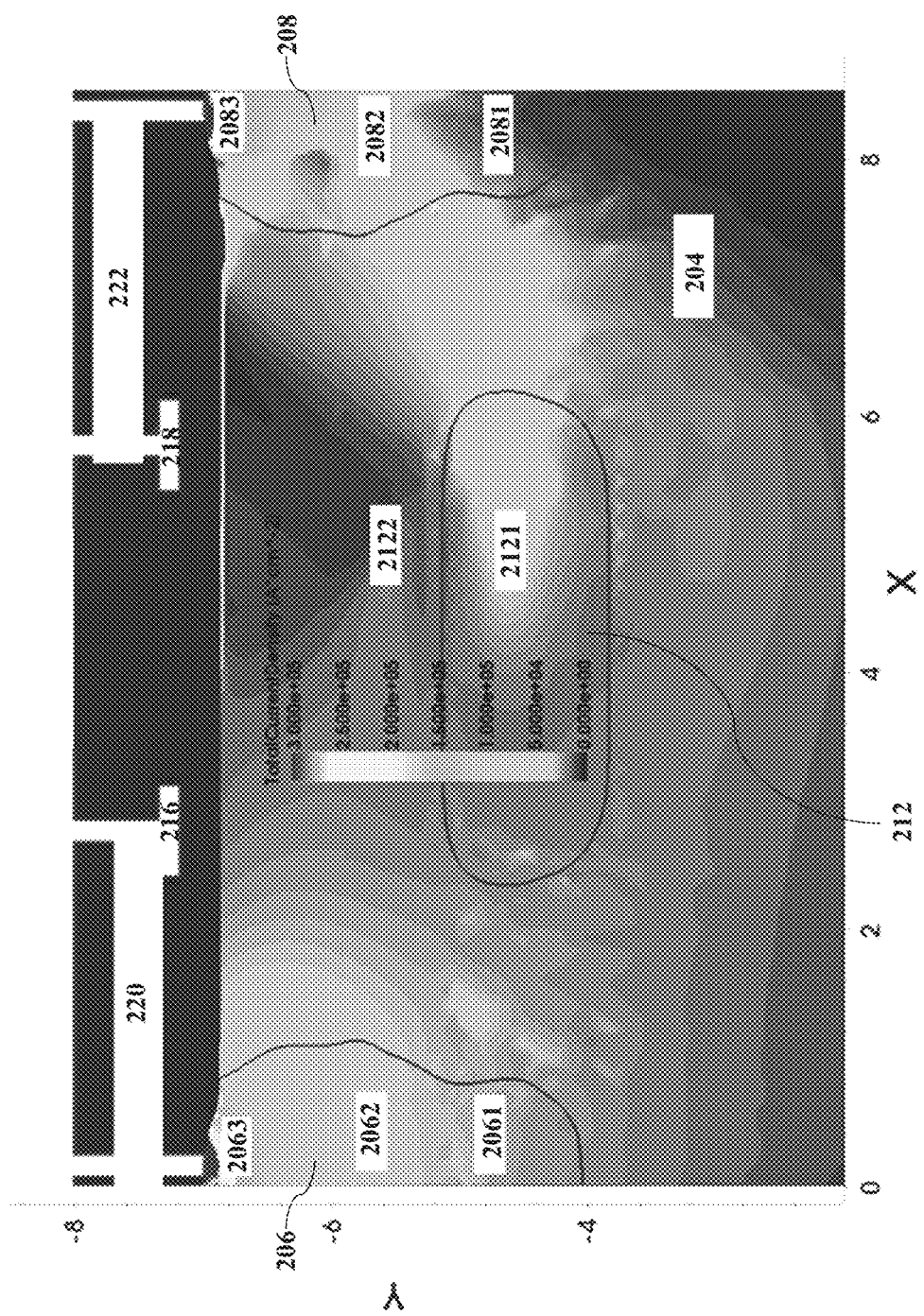
FIG. 8 shows a simulated current density map of the ESD protection device of FIG. 2A.

FIG. 8 shows a simulated current density map of the ESD protection device 200 when the TLP current is approximately 1 mA/um and when the voltage at the second terminal point 222 is higher than that at the first terminal point 220. As mentioned above, the main discharge current flowing through the ESD protection device 200 may be the second current 304 through the buried layer 2121; whereas, the first current 302 through the drift region 2122 may be smaller in magnitude than the second current 304. Accordingly, as shown in FIG. 8, the current density within the buried layer 2121 is much higher than that within the drift region 2122.

As described above, the ESD protection device 200 may be a bi-directional device capable of supporting dual polarity bias (either positive bias when the voltage at the first terminal point 220 is higher than the voltage at the second terminal point 222, or negative bias when the voltage at the first terminal point 220 is lower than the voltage at the second terminal point 222). In other words, the ESD protection device 200 may be able to conduct current away from the electrical device to be protected regardless of the direction of the ESD through the electrical device. Further, as shown in FIGS. 5 to 8, the field distribution structure 210 of the ESD protection device 200 may help to reduce the electric field near the surface of the substrate 202. In particular, the first conductive plate 216 and the second conductive plate 218 may help to modulate the surface electric field of the substrate 202, and the buried layer 2121 may help to modulate the electric field within the substrate 202. Accordingly, the electric field within the substrate 202 may be more uniform and therefore, the ESD protection device 200 can withstand a higher breakdown voltage, which may be useful in several high voltage applications. With the more uniform electric field within the substrate 202, the lateral distance between the terminal regions 206, 208 may be reduced without substantially compromising the breakdown voltage the device 200 can withstand. In turn, this helps to lower the on-resistance of the ESD protection device 200 and increase the failure current of this device 200. The ESD protection device 200 may thus have a better clamping ability and may be more compact with at least 50% reduction in silicon footprint as compared to prior art devices.

Figure 9:
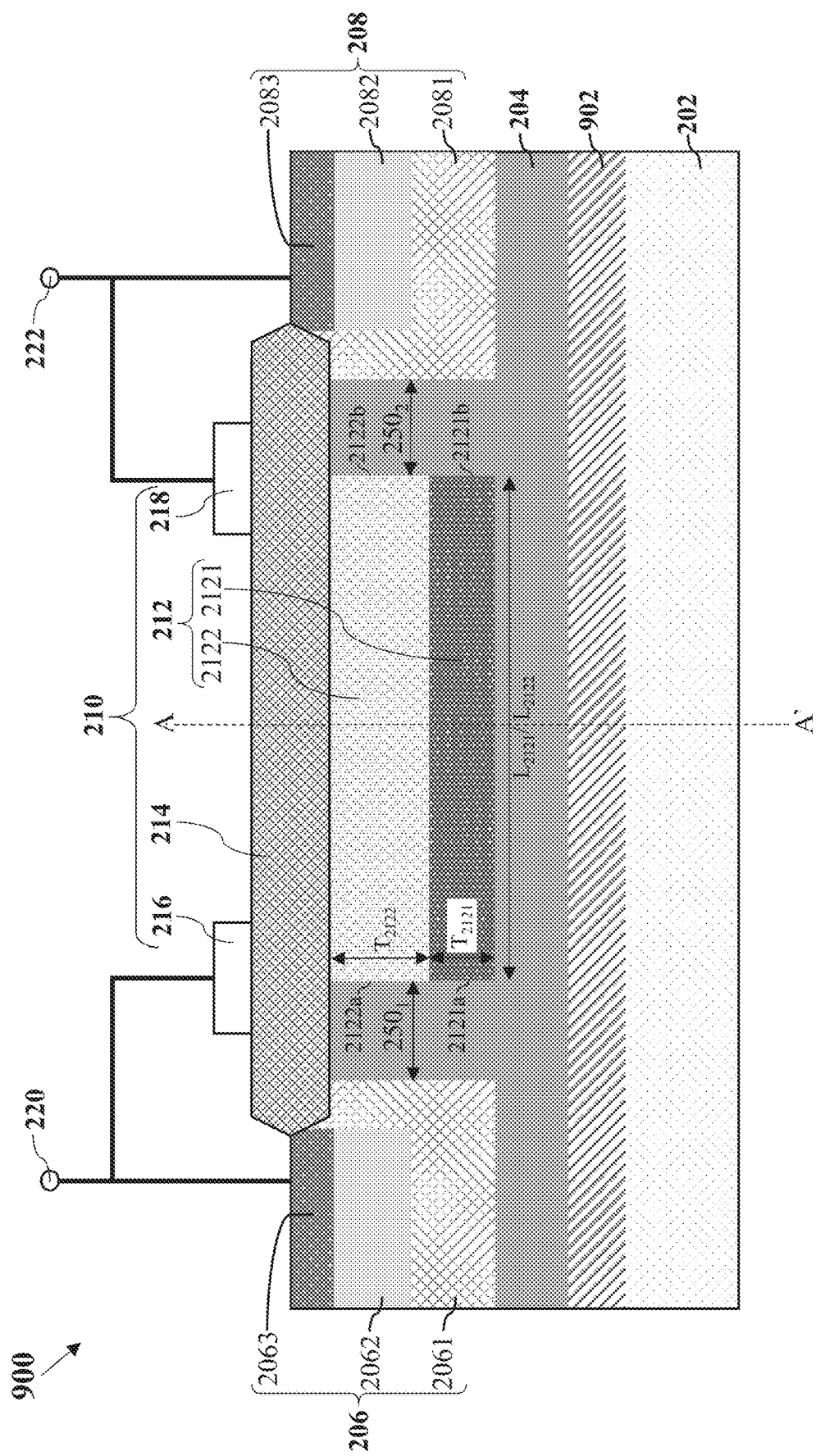
FIG. 9 shows a simplified cross-sectional view of an ESD protection device according to alternative non-limiting embodiments.

FIG. 9 shows a simplified cross-sectional view of an ESD protection device 900 according to alternative non-limiting embodiments. The ESD protection device 900 is similar to the ESD protection device 200, and thus, the common features are labelled with the same reference numerals and need not be discussed.

As compared to the ESD protection device 200, the ESD protection device 900 may further include a buried region 902 arranged within the conductivity region 204. The buried region 902 may be vertically spaced apart from the first terminal region 206 and the second terminal region 208. In other words, a portion of the conductivity region 204 may be arranged between the terminal regions 206, 208 and the buried region 902. The doping concentration of the buried region 902 may be higher than that of the conductivity region 204. For example, while the conductivity region 204 may have a doping concentration from about 5E15 $cm^{-3}$ to about 5E16 cm$^{-3}$, the buried region 902 may have a doping concentration from about 1E18 cm$^{-3}$ to about 1E20 cm$^{-3}$.

Figure 10:
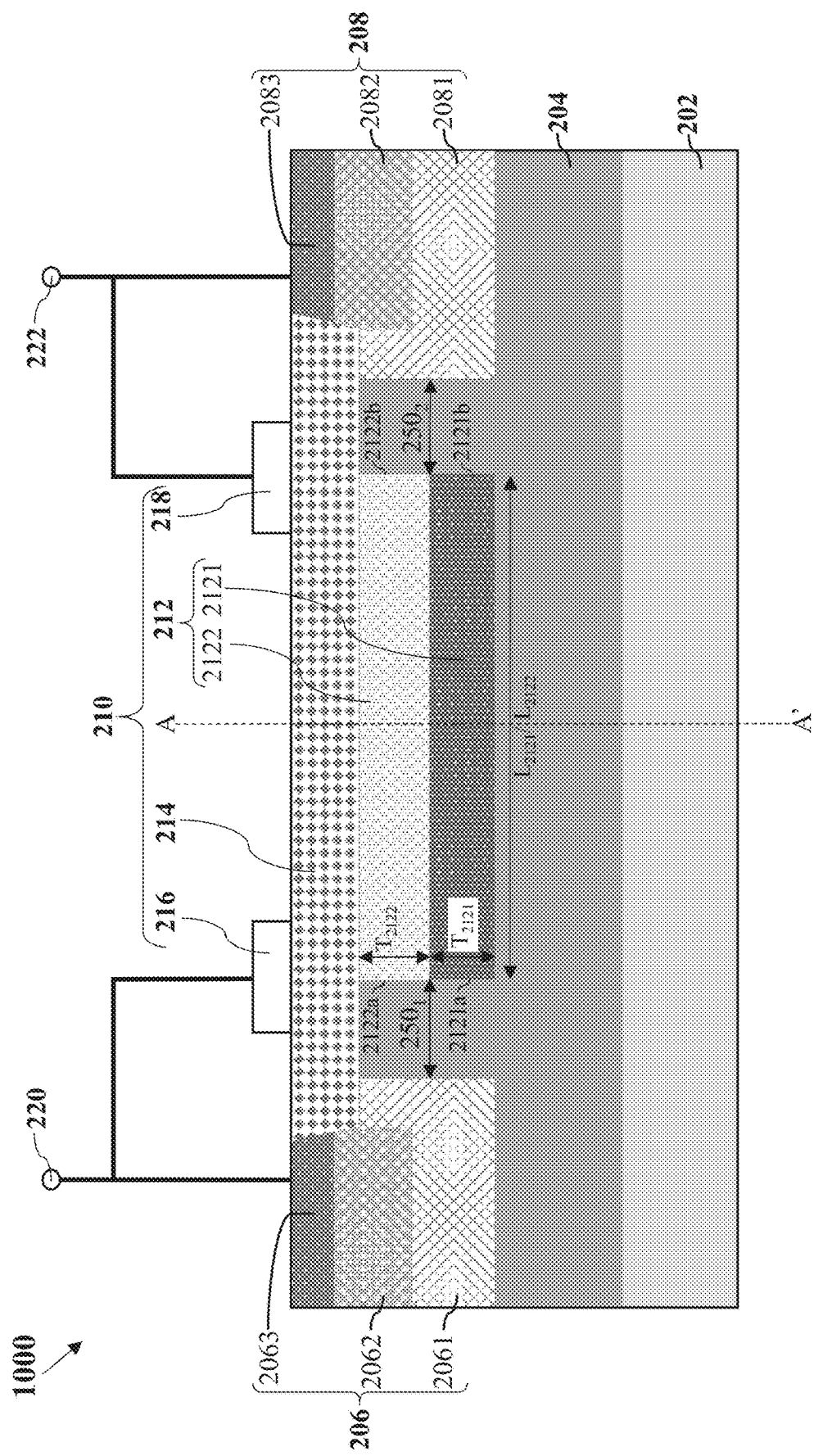
FIG. 10 shows a simplified cross-sectional view of an ESD protection device according to alternative non-limiting embodiments.

FIG. 10 shows a simplified cross-sectional view of an ESD protection device 1000 according to alternative non-limiting embodiments. The ESD protection device 1000 is similar to the ESD protection device 200, and thus, the common features are labelled with the same reference numerals and need not be discussed.

As compared to the ESD protection device 200, in the ESD protection device 1000, the isolation element 214 may include a shallow trench isolation (STI) element instead of a LOCOS element. Further, the isolation element 214 may be arranged entirely within the conductivity region 204. The isolation element 214 may similarly extend continuously between the contact portions 2063, 2083 of the first terminal region 206 and the second terminal region 208. In particular, the isolation element 214 may extend across the drift regions 2061, 2081 of these terminal regions 206, 208 to adjoin the respective contact portions 2063, 2083. As depicted in FIG. 10, the isolation element 214 may extend partially into the contact portions 2063, 2083. Further, the isolation element 214 may also extend vertically into the well portions 2062, 2082.

Figure 11:
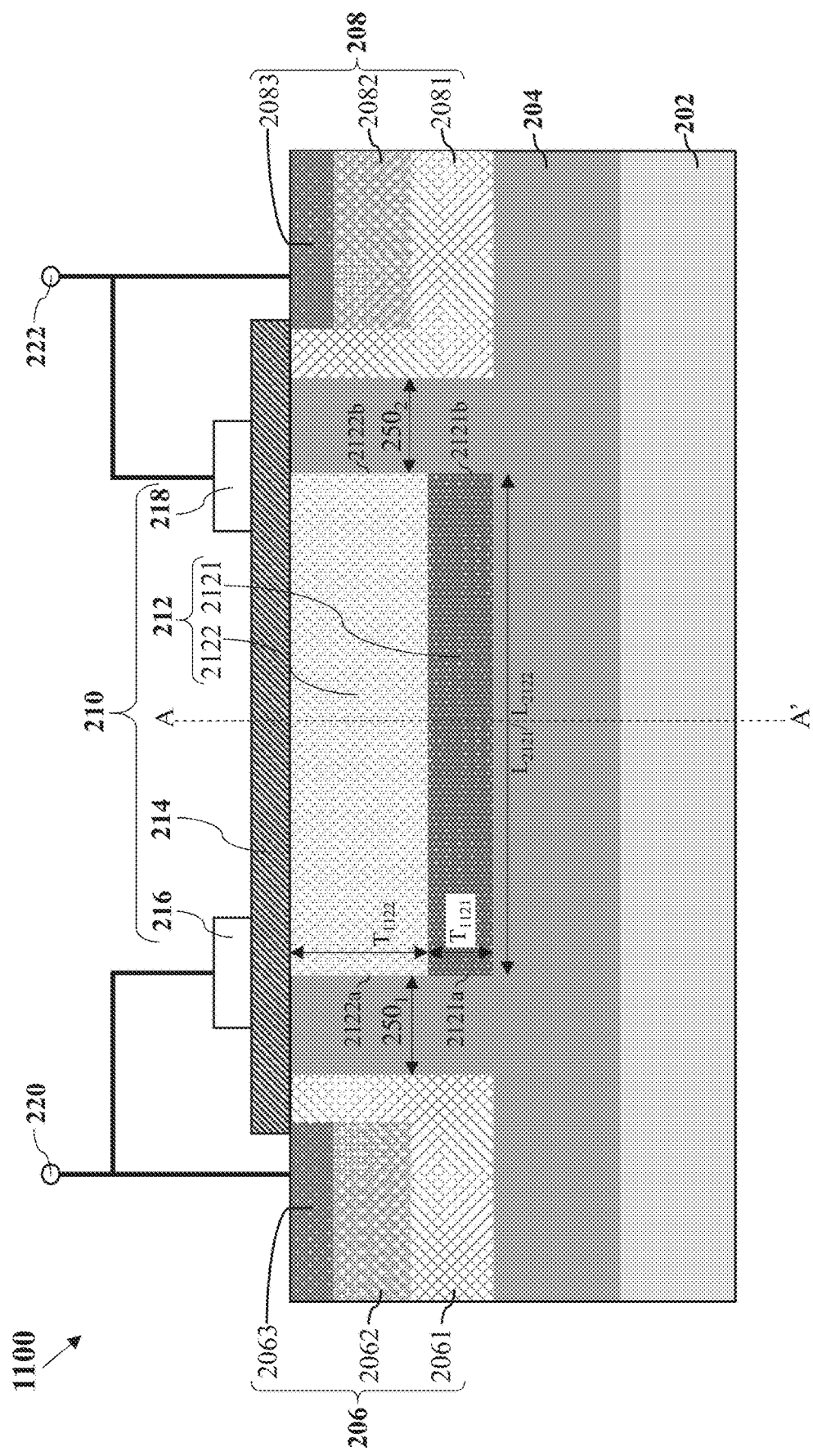
FIG. 11 shows a simplified cross-sectional view of an ESD protection device according to alternative non-limiting embodiments.

FIG. 11 shows a simplified cross-sectional view of an ESD protection device 1100 according to alternative non-limiting embodiments. The ESD protection device 1100 is similar to the ESD protection device 200, and thus, the common features are labelled with the same reference numerals and need not be discussed.

As compared to the ESD protection device 200, in the ESD protection device 1100, the isolation element 214 may include a field oxide deposition (FOD) element instead of a LOCOS element. Further, the isolation element 214 may be arranged entirely over the substrate 202. The isolation element 214 may similarly extend continuously between the contact portions 2063, 2083 of the first terminal region 206 and the second terminal region 208. As depicted in FIG. 11, the isolation element 214 may overlap partially with the contact portions 2063, 2083. In particular, the isolation element 214 may extend across the drift region 2061 of the first terminal region 206 to overlap with the contact portion 2063 of the first terminal region 206, and across the drift region 2081 of the second terminal region 208 to overlap with the contact portion 2083 of the second terminal region 208.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An electrostatic discharge (ESD) protection device comprising:
   a substrate comprising a conductivity region arranged therein;
   a first terminal region and a second terminal region arranged within the conductivity region; and
   a field distribution structure comprising:
   an intermediate region arranged within the conductivity region between the first terminal region and the second terminal region, wherein the intermediate region comprises a buried layer and a drift region arranged over the buried layer;
   an isolation element arranged over the intermediate region; and
   a first conductive plate and a second conductive plate arranged over the isolation element; wherein the first conductive plate is electrically connected to the first terminal region and the second conductive plate is electrically connected to the second terminal region,
   wherein the substrate, the first terminal region, the second terminal region, and the buried layer have a first conductivity type; and wherein the conductivity region and the drift region have a second conductivity type different from the first conductivity type.

2. The ESD protection device of claim 1, wherein a portion of the conductivity region is arranged between the intermediate region and the first terminal region; and wherein another portion of the conductivity region is arranged between the intermediate region and the second terminal region.

3. The ESD protection device of claim 1, wherein a first lateral spacing is arranged between the intermediate region and the first terminal region; and wherein a second lateral spacing is arranged between the intermediate region and the second terminal region.

4. The ESD protection device of claim 3, wherein a length of the first lateral spacing and a length of the second lateral spacing are approximately equal.

5. The ESD protection device of claim 1, wherein a first side of the drift region and a first side of the buried layer are vertically aligned, and a second side opposite to the first side of the drift region and a second side opposite to the first side of the buried layer are vertically aligned.

6. The ESD protection device of claim 1, wherein the isolation element adjoins the first terminal region and the second terminal region.

7. The ESD protection device of claim 1, wherein the isolation element extends continuously between the first terminal region and the second terminal region.

8. The ESD protection device of claim 1, wherein the conductivity region comprises a high voltage well.

9. The ESD protection device of claim 1, further comprising a buried region arranged within the conductivity region.

10. The ESD protection device of claim 1, wherein each of the first terminal region and the second terminal region comprises:
    a drift portion;
    a well portion arranged within the drift portion; and
    a contact portion arranged within the well portion.

11. The ESD protection device of claim 10, wherein the first conductive plate is electrically connected to the contact portion of the first terminal region; and wherein the second conductive plate is electrically connected to the contact portion of the second terminal region.

12. The ESD protection device of claim 10, wherein the isolation element extends between the contact portion of the first terminal region and the contact portion of the second terminal region.

13. The ESD protection device of claim 12, wherein the isolation element extends across the drift region of the first terminal region and across the drift region of the second terminal region.

14. The ESD protection device of claim 10, wherein the first conductivity type is selected from p-type or n-type, and the second conductivity type is selected from p-type or n-type, and wherein the well portion has a higher doping concentration than the drift portion, and the contact portion has a higher doping concentration than the well portion.

15. The ESD protection device of claim 10, wherein the isolation element extends partially into the contact portion of the first and second terminal regions.

16. The ESD protection device of claim 1, wherein the isolation element comprises a local oxidation of silicon (LOCOS) element; and wherein the isolation element is arranged partially within the conductivity region.

17. The ESD protection device of claim 1, wherein the isolation element comprises a shallow trench isolation (STI) element; and wherein the isolation element is arranged entirely within the conductivity region.

18. The ESD protection device of claim 1, wherein the isolation element comprises a field oxide deposition (FOD) element; and wherein the isolation element is arranged entirely over the substrate.

19. The ESD protection device of claim 1, wherein the first conductivity type is selected from p-type or n-type, and the second conductivity type is selected from p-type or n-type, wherein at least a part of the first conductive plate is in vertical alignment with a first p-n junction between a first side of the buried layer and the conductivity region; and wherein at least a part of the second conductive plate is in vertical alignment with a second p-n junction between a second side of the buried layer and the conductivity region, the first side of the buried layer is horizontally opposite the second side of the buried layer.

20. A method of forming an ESD protection device, the method comprising:
providing a substrate;
forming a conductivity region within the substrate;
forming a first terminal region and a second terminal region within the conductivity region;
forming a field distribution structure comprising:
an intermediate region within the conductivity region between the first
terminal region and the second terminal region, wherein the intermediate
region comprises a buried layer and a drift region above the buried layer;
an isolation element over the intermediate region; and
a first conductive plate and a second conductive plate over the isolation element; and
forming an electrical connection between the first conductive plate and the first terminal region; and forming an electrical connection between the second conductive plate and the second terminal region,
wherein the substrate, the first terminal region, the second terminal region, and the buried layer have a first conductivity type; and wherein the conductivity region and the drift region have a second conductivity type different from the first conductivity type.

* * * * *